United States Patent
Kim et al.

(10) Patent No.: US 9,503,107 B1
(45) Date of Patent: Nov. 22, 2016

(54) CLOSED LOOP BANK SELECTION FOR TEMPERATURE COMPENSATION IN WIRELESS SYSTEMS

(71) Applicant: QUALCOMM Incorporated, San Diego, CA (US)

(72) Inventors: Young Gon Kim, San Jose, CA (US); Burcin Baytekin, Milpitas, CA (US); Yido Koo, Belmont, CA (US); Emilia Vailun Lei, Union City, CA (US); Jeongsik Yang, San Jose, CA (US); Yongwang Ding, Dublin, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/885,690

(22) Filed: Oct. 16, 2015

Related U.S. Application Data

(60) Provisional application No. 62/197,191, filed on Jul. 27, 2015.

(51) Int. Cl.
  *H03L 7/10* (2006.01)
  *H03L 7/187* (2006.01)

(52) U.S. Cl.
  CPC ............... *H03L 7/103* (2013.01); *H03L 7/10* (2013.01); *H03L 7/187* (2013.01)

(58) Field of Classification Search
  CPC ............... H03L 7/10–7/103; H03L 7/187
  USPC ................... 331/16; 327/156, 157
  See application file for complete search history.

(56) References Cited

U.S. PATENT DOCUMENTS

| | | | |
|---|---|---|---|
| 6,583,675 B2* | 6/2003 | Gomez | H03L 7/1072 331/17 |
| 7,164,325 B2 | 1/2007 | Aparin et al. | |
| 7,940,129 B1* | 5/2011 | Tsang | H03L 1/02 331/17 |
| 8,248,167 B2 | 8/2012 | Bolton | |
| 8,412,120 B2* | 4/2013 | Fujiwara | H03L 7/102 324/72 |
| 8,493,114 B2 | 7/2013 | Cho et al. | |
| 2003/0050029 A1* | 3/2003 | Kaufmann | H03L 7/099 455/260 |
| 2008/0212658 A1* | 9/2008 | Rofougaran | H03L 7/18 375/219 |
| 2009/0033428 A1 | 2/2009 | Karri | |

FOREIGN PATENT DOCUMENTS

WO   WO-2015075496 A1   5/2015

* cited by examiner

*Primary Examiner* — Ryan Johnson
(74) *Attorney, Agent, or Firm* — Paradice and Li LLP

(57) ABSTRACT

The disclosure is directed to compensating for frequency drift in a voltage-controlled oscillator (VCO). Example methods and systems are described which may detect a signal edge associated with a transceiver, and determine whether one or more lock quality signals indicate that the VCO frequency is outside of an specified range, indicating an unacceptable amount of frequency drift. A frequency tuning setting of the VCO may be adjusted based on the one or more lock quality signals, and a determination may be made whether or not the one or more lock quality signals indicate that the VCO frequency has returned to the specified range. The adjustment of the frequency tuning setting of the VCO may be repeated until the VCO frequency returns to the specified range.

24 Claims, 9 Drawing Sheets

CLOSED LOOP BANK SELECTION FOR TEMPERATURE COMPENSATION IN WIRELESS SYSTEMS

RELATED APPLICATION

This application claims priority to U.S. Provisional Patent Application No. 62/197,191, titled "Closed Loop Bank Selection for Temperature Compensation in Wireless Systems," filed Jul. 27, 2015, which is hereby incorporated by reference in its entirety.

TECHNICAL FIELD

The example embodiments relate generally to wireless communications networks, and specifically to compensating for frequency drift in voltage controlled oscillators (VCOs).

BACKGROUND OF RELATED ART

VCOs are an important part of many electronics circuits and are particularly important in communication circuits. For example, VCOs may be used to generate local oscillator signals used by transceiver subsystems for frequency up-conversion and down-conversion. VCOs are also used to generate clock signals. Multiple VCOs may be present in a wireless device for such functions.

A VCO is typically designed to operate at a specific frequency or in a specific range of frequencies. The frequency of oscillation for the VCO may deviate from a nominal design value due to various factors such as circuit component tolerances, integrated circuit manufacturing process variations, circuit component aging, etc. The oscillation frequency may also drift during normal operation due to various factors such as temperature, power supply variation, etc.

The VCO may include a programmable capacitor bank to aid with the adjustment of the oscillation frequency. The capacitor bank may contain a bank of tuning capacitors that may be individually switched on or off. Each tuning capacitor may adjust the oscillation frequency when switched on. The tuning capacitors typically have binary weighted capacitances. Different total tuning capacitances may be obtained by switching on the appropriate tuning capacitor(s).

One method for compensating for frequency drift is to periodically relock the VCO using the capacitor bank. However, the periodic relock may occur too frequently, resulting in loss of air time because, for example, each relock may take as long as 100 μs to complete. Alternatively, the periodic relock may be too infrequent, resulting in unacceptable performance degradation due to frequency drift.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

An apparatus and method are disclosed that may compensate for frequency drift of a voltage controlled oscillator (VCO). For an example embodiment, a wireless device may detect a signal edge which is associated with a transceiver; determine that one or more lock quality signals indicate that the VCO frequency is outside of a specified frequency range (e.g., outside of a frequency range that provides an acceptable level of performance); adjust a frequency tuning setting—such as a capacitor bank code—of the VCO based on the one or more lock quality signals; and determine that the one or more lock quality signals indicate that the VCO frequency has returned to the specified frequency range.

The frequency tuning setting may be adjusted by a predetermined amount, and in a direction indicated by the one or more lock quality signals. The predetermined amount may be based at least in part on a current value of the frequency tuning setting. For some examples, the frequency tuning setting may be repeatedly adjusted until the one or more lock quality signals indicate that the VCO frequency has returned to the specified frequency range.

For at least some embodiments, the signal edge may be a rising edge or a falling edge of a signal associated with enabling or disabling a transmitter or receiver (e.g., a signal such as a "transmitter on" signal and/or a "receiver on" signal). The one or more lock quality signals may include (or may be derived from) one or more signals indicating a status of a VCO fine tuning voltage (Vtune), for example, such as (i) a signal indicating that Vtune is above a specified range or value and/or (ii) a signal indicating that Vtune is below the specified range or value.

In some examples, the set of frequency tuning settings may include one or more frequency tuning settings associated with a region of frequency overlap in the VCO. For example, the frequency tuning setting may be adjusted by determining that the current value of the frequency tuning setting is associated with a region of frequency overlap, and in response thereto, triggering an open-loop VCO calibration operation.

BRIEF DESCRIPTION OF THE DRAWINGS

The example embodiments are illustrated by way of example and are not intended to be limited by the figures of the accompanying drawings, where.

Like reference numerals refer to corresponding parts throughout the drawing figures.

DETAILED DESCRIPTION

Figure 1:
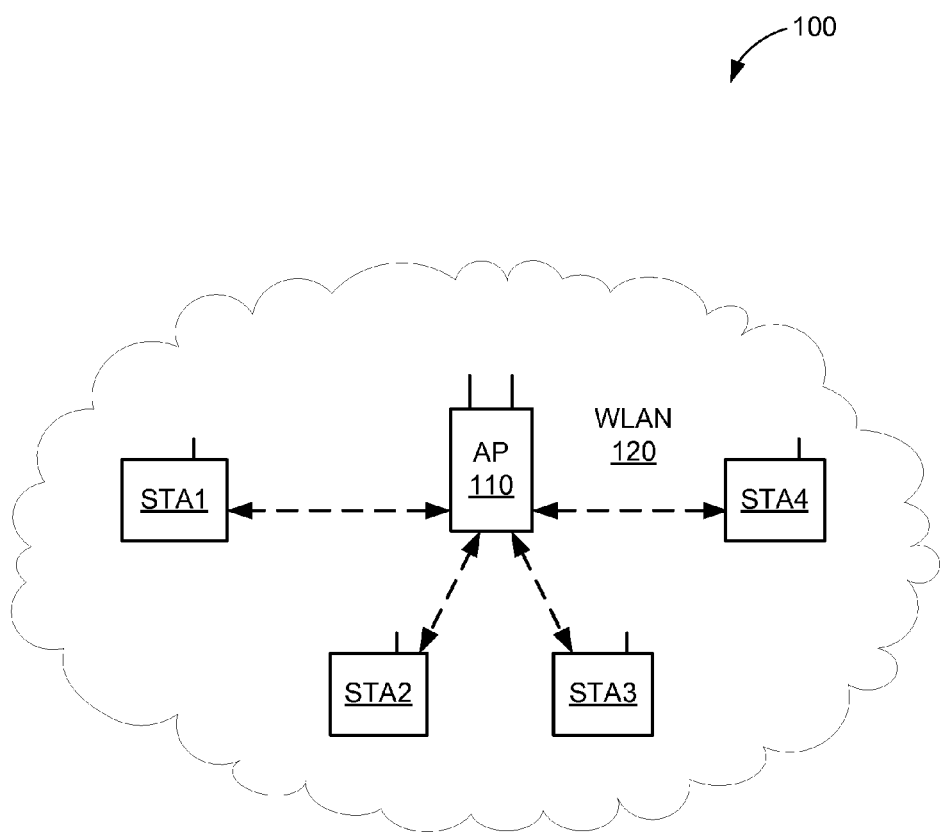
FIG. 1 shows a block diagram of a wireless system within which the example embodiments may be implemented.

The example embodiments are described below in the context of WLAN systems for simplicity only. It is to be understood that the example embodiments are equally applicable to other wireless networks (e.g., cellular networks, pico networks, femto networks, satellite networks), as well as for systems using signals of one or more wired standards or protocols (e.g., Ethernet and/or HomePlug/PLC standards). As used herein, the terms "WLAN" and "Wi-Fi®" may include communications governed by the IEEE 802.11 family of standards, Bluetooth, HiperLAN (a set of wireless standards, comparable to the IEEE 802.11 standards, used primarily in Europe), and other technologies having relatively short radio propagation range. Thus, the terms "WLAN" and "Wi-Fi" may be used interchangeably herein. In addition, although described below in terms of an infrastructure WLAN system including one or more APs and a number of STAs, the example embodiments are equally applicable to other WLAN systems including, for example, multiple WLANs, peer-to-peer (or Independent Basic Service Set) systems, Wi-Fi Direct systems, and/or Hotspots. In addition, although described herein in terms of exchanging data frames between wireless devices, the example embodiments may be applied to the exchange of any data unit, packet, and/or frame between wireless devices. Thus, the term "frame" may include any frame, packet, or data unit such as, for example, protocol data units (PDUs), Media Access Control (MAC) protocol data units (MPDUs), and physical layer convergence procedure protocol data units (PPDUs). The term "A-MPDU" may refer to aggregated MPDUs.

In the following description, numerous specific details are set forth such as examples of specific components, circuits, and processes to provide a thorough understanding of the present disclosure. The term "coupled" as used herein means connected directly to or connected through one or more intervening components or circuits. The term "associated AP" refers to an AP with which a given STA is associated (e.g., there is an established communication channel or link between the AP and the given STA). The term "non-associated AP" refers to an AP with which a given STA is not associated (e.g., there is not an established communication channel or link between the AP and the given STA, and thus the AP and the given STA may not yet exchange data frames). The term "associated STA" refers to a STA that is associated with a given AP, and the term "non-associated STA" refers to a STA that is not associated with the given AP.

Also, in the following description and for purposes of explanation, specific nomenclature is set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. The example embodiments are not to be construed as limited to specific examples described herein but rather to include within their scopes all embodiments defined by the appended claims.

As described above, voltage controlled oscillators (VCOs) are frequently used within communications devices, such as wireless communications devices. For example, VCOs may be used within phase locked loops (PLLs), to provide local oscillator (LO) signals, to generate clock signals, and so on. One problem with VCOs is that they typically exhibit frequency drift, such as temperature-dependent frequency drift, power supply dependent frequency drift, etc. This may be problematic, as a VCO may operate in environments having a variety of ambient temperatures. Additionally, a VCO may experience substantial temperature variation as a host device proceeds from initial power up to full-power operation. One typical method of compensating for VCO frequency drift is to periodically relock the VCO, for example, to compensate for temperature or power supply drift. For example, relocking the VCO may involve performing an open loop bank selection operation to determine an appropriate setting of a frequency tuning setting to generate a VCO output of the desired frequency. The frequency tuning setting may be a setting of a VCO capacitor bank, a VCO varactor voltage, a VCO regulator output, a VCO gain setting, etc. If the frequency tuning setting is a capacitor bank setting, the capacitors in the VCO capacitor bank may be individually switched on or off. The overall setting of these switches characterizes the setting of the capacitor bank, and may be called a bank code, or a capacitor bank code.

One problem with compensating for temperature-dependent frequency drift with such a periodic relock is that the relock may occur too frequently, or not frequently enough. If the periodic relock is too frequent, and relocks the VCO before frequency drift becomes unacceptably large, then air time may be lost. This may be particularly problematic once a device has reached its typical operating temperature, as temperature changes—and consequently temperature-dependent frequency drift—may be minimal, while each periodic relock may take as long as 100 μs. On the other hand, if the periodic frequency relock is too infrequent, then temperature-dependent frequency drift may reach unacceptable levels before a relock occurs, and performance may suffer. It is therefore desirable to compensate for temperature-dependent frequency drift when, and only when, such frequency drift reaches unacceptable levels.

Accordingly, the example embodiments describe systems and methods for determining when a lock indicator associated with a VCO indicates an unacceptable level of temperature-dependent frequency drift. The lock indicator may be a VCO fine tuning voltage which may be called Vtune. When unacceptable levels of drift are indicated, a closed-loop bank selection operation may be triggered, which may determine a new frequency tuning setting, such as a new bank code, to compensate for the indicated frequency drift. These and other details of the example embodiments, which provide one or more technical solutions to the aforementioned technical problems, are described in more detail below.

FIG. 1 is a block diagram of a wireless system 100 within which the example embodiments may be implemented. The wireless system 100 is shown to include four wireless stations STA1-STA4, a wireless access point (AP) 110, and a wireless local area network (WLAN) 120. The WLAN 120 may be formed by a plurality of Wi-Fi access points (APs) that may operate according to the IEEE 802.11 family of standards (or according to other suitable wireless protocols). Thus, although only one AP 110 is shown in FIG. 1 for simplicity, it is to be understood that WLAN 120 may be formed by any number of access points such as AP 110. The AP 110 is assigned a unique MAC address that is programmed therein by, for example, the manufacturer of the access point. Similarly, each of STA1-STA4 is also assigned a unique MAC address. For some embodiments, the wireless system 100 may correspond to a multiple-input multiple-output (MIMO) wireless network. Further, although the WLAN 120 is depicted in FIG. 1 as an infrastructure BSS, for other embodiments, WLAN 120 may be an IBSS, an ad-hoc network, or a peer-to-peer (P2P) network (e.g., operating according to the Wi-Fi Direct protocols).

Each of stations STA1-STA4 may be any suitable Wi-Fi enabled wireless device including, for example, a cell phone, personal digital assistant (PDA), tablet device, laptop computer, or the like. Each station STA may also be referred to as a user equipment (UE), a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. For at least some embodiments, each station STA may include one or more transceivers, one or more processing resources (e.g., processors and/or ASICs), one or more memory resources, and a power source (e.g., a battery). The memory resources may include a non-transitory computer-readable medium (e.g., one or more nonvolatile memory elements, such as EPROM, EEPROM, Flash memory, a hard drive, etc.) that stores instructions for performing operations described below with respect to FIG. 8.

The AP 110 may be any suitable device that allows one or more wireless devices to connect to a network (e.g., a local area network (LAN), wide area network (WAN), metropolitan area network (MAN), and/or the Internet) via AP 110 using Wi-Fi, Bluetooth, or any other suitable wireless communication standards. For at least one embodiment, AP 110 may include one or more transceivers, one or more processing resources (e.g., processors and/or ASICs), one or more memory resources, and a power source. The memory resources may include a non-transitory computer-readable medium (e.g., one or more nonvolatile memory elements, such as EPROM, EEPROM, Flash memory, a hard drive, etc.) that stores instructions for performing operations described below with respect to FIG. 8.

For the stations STA1-STA4 and/or AP 110, the one or more transceivers may include Wi-Fi transceivers, Bluetooth transceivers, cellular transceivers, and/or other suitable radio frequency (RF) transceivers (not shown for simplicity) to transmit and receive wireless communication signals. Each transceiver may communicate with other wireless devices in distinct operating frequency bands and/or using distinct communication protocols. For example, the Wi-Fi transceiver may communicate within a 2.4 GHz frequency band and/or within a 5 GHz frequency band in accordance with the IEEE 802.11 specification. The cellular transceiver may communicate within various RF frequency bands in accordance with a 4G Long Term Evolution (LTE) protocol described by the 3rd Generation Partnership Project (3GPP) (e.g., between approximately 700 MHz and approximately 3.9 GHz) and/or in accordance with other cellular protocols (e.g., a Global System for Mobile (GSM) communications protocol). In other embodiments, the transceivers included within the STA may be any technically feasible transceiver such as a ZigBee transceiver described by a specification from the ZigBee specification, a WiGig transceiver, and/or a HomePlug transceiver described a specification from the HomePlug Alliance.

While FIG. 1 shows a wireless network within which some of the example embodiments may be implemented, some other examples may be implemented in wired systems. For example, various wired systems include phase locked loops, function generators, frequency synthesizers, or other circuits including one or more voltage controlled oscillators. Such oscillators may also experience frequency drift due to factors such as temperature, power supply variation, etc.

Figure 2:
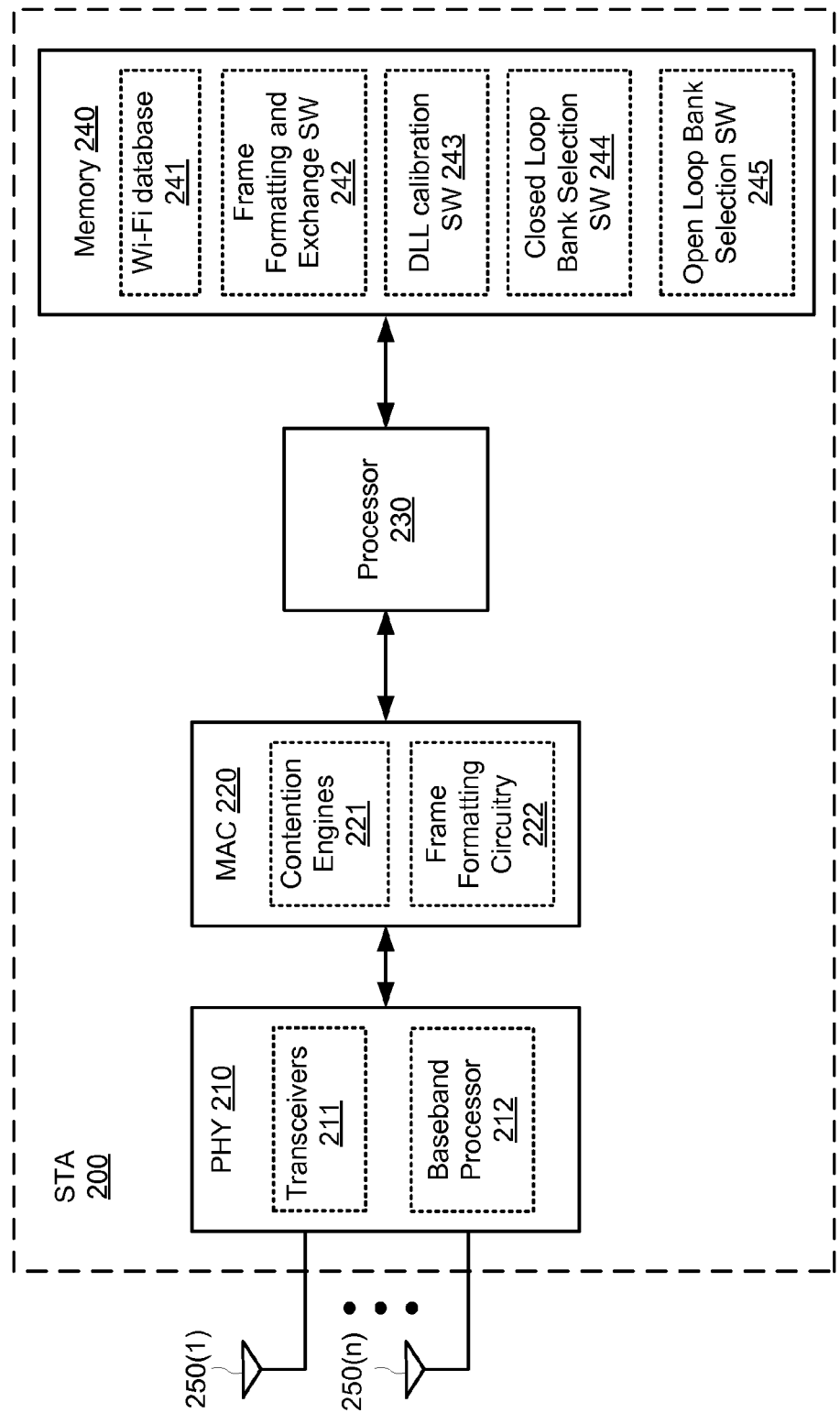
FIG. 2 shows a block diagram of a wireless station (STA) in accordance with example embodiments.

FIG. 2 shows an example STA 200 that may be one embodiment of the station STA of FIG. 1. The STA 200 may include a physical layer (PHY) 210 including at least a number of transceivers 211 and a baseband processor 212, may include a MAC 220 including at least a number of contention engines 221 and frame formatting circuitry 222, may include a processor 230, may include a memory 240, and may include a number of antennas 250(1)-250(n). The transceivers 211 may be coupled to antennas 250(1)-250(n), either directly or through an antenna selection circuit (not shown for simplicity). The transceivers 211 may be used to transmit signals to and receive signals from AP 110 and/or other STAs (see also FIG. 1), and may be used to scan the surrounding environment to detect and identify nearby access points and/or other STAs (e.g., within wireless range of STA 200). Although not shown in FIG. 2 for simplicity, the transceivers 211 may include any number of transmit chains to process and transmit signals to other wireless devices via antennas 250(1)-250(n), and may include any number of receive chains to process signals received from antennas 250(1)-250(n). Thus, for example embodiments, the STA 200 may be configured for multiple-input, multiple-output (MIMO) operations. The MIMO operations may include single-user MIMO (SU-MIMO) operations and multi-user MIMO (MU-MIMO) operations.

The baseband processor 212 may be used to process signals received from processor 230 and/or memory 240 and to forward the processed signals to transceivers 211 for transmission via one or more of antennas 250(1)-250(n), and may be used to process signals received from one or more of antennas 250(1)-250(n) via transceivers 211 and to forward the processed signals to processor 230 and/or memory 240.

For purposes of discussion herein, MAC 220 is shown in FIG. 2 as being coupled between PHY device 210 and processor 230. For actual embodiments, PHY device 210, MAC 220, processor 230, and/or memory 240 may be connected together using one or more buses (not shown for simplicity).

The contention engines 221 may contend for access to one or more shared wireless mediums, and may also store packets for transmission over the one or more shared wireless mediums. The STA 200 may include one or more contention engines 221 for each of a plurality of different access categories. For other embodiments, the contention engines 221 may be separate from MAC 220. For still other embodiments, the contention engines 221 may be implemented as one or more software modules (e.g., stored in memory 240 or stored in memory provided within MAC 220) containing instructions that, when executed by processor 230, perform the functions of contention engines 221.

The frame formatting circuitry 222 may be used to create and/or format frames received from processor 230 and/or memory 240 (e.g., by adding MAC headers to PDUs provided by processor 230), and may be used to re-format frames received from PHY device 210 (e.g., by stripping MAC headers from frames received from PHY device 210).

Memory 240 may include an AP profile data store 241 that stores profile information for a plurality of APs. The profile information for a particular AP may include information including, for example, the AP's SSID, MAC address, channel information, RSSI values, goodput values, channel state information (CSI), supported data rates, connection history with STA 200, a trustworthiness value of the AP (e.g., indicating a level of confidence about the AP's location, etc.), and any other suitable information pertaining to or describing the operation of the AP.

Figure 8:
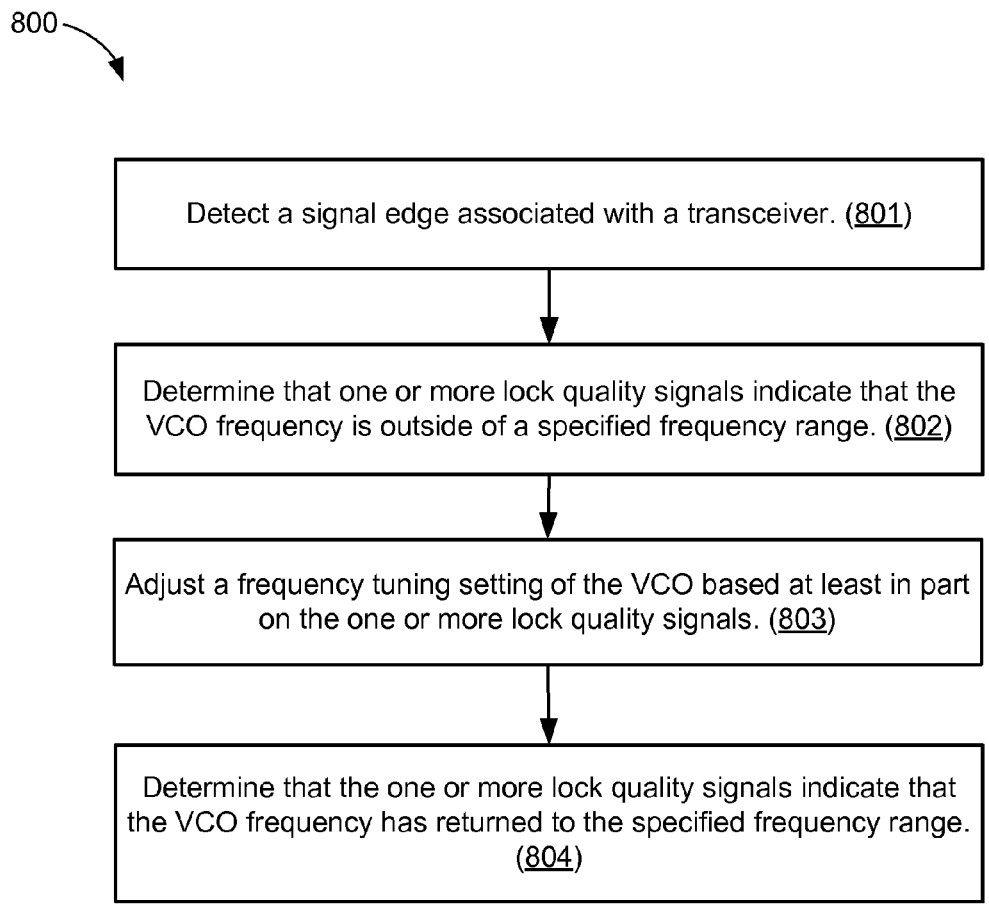
FIG. 8 shows an illustrative flow chart depicting example operations to compensate for temperature-dependent frequency drift of a VCO.

Memory 240 may also include a non-transitory computer-readable medium (e.g., one or more nonvolatile memory elements, such as EPROM, EEPROM, Flash memory, a hard drive, and so on) that may store at least the following software (SW) modules:

- a frame formatting and exchange software module 242 to facilitate the creation and exchange of any suitable frames (e.g., data frames, action frames, and management frames) between STA 200 and other wireless devices (e.g., as described for one or more operations of FIG. 8);
- a delay locked loop (DLL) calibration software module 243 to facilitate (i) a determination of DLL lock quality, and (ii) the calibration and relocking of a delay locked loop (e.g., as described for one or more operations of FIG. 8);
- a closed loop bank selection software module 244 to facilitate a determination that a tuning voltage indicates a VCO needs to be relocked, and to facilitate an iterative determination of an appropriate frequency tuning setting to relock the VCO (e.g., as described for one or more operations of FIG. 8); and
- an open loop bank selection software module 245 to facilitate the performance of an open-loop VCO calibration operation (e.g., by resetting a synthesizer of the VCO) for determining an appropriate frequency tuning setting for the VCO (e.g., as described for one or more operations of FIG. 8).

Each software module includes instructions that, when executed by processor 230, cause STA 200 to perform the corresponding functions. The non-transitory computer-readable medium of memory 240 thus includes instructions for performing all or a portion of the STA-side operations depicted in FIG. 8.

Processor 230, which is shown in the example of FIG. 2 as coupled to PHY device 210, to MAC 220, and to memory 240, may be any suitable one or more processors capable of executing scripts or instructions of one or more software programs stored in STA 200 (e.g., within memory 240). For example, processor 230 may execute the frame formatting and exchange software module 242 to facilitate the creation and exchange of any suitable frames (e.g., data frames, action frames, and management frames) between STA 200 and other wireless devices. Processor 230 may also execute the delay locked loop (DLL) calibration software module 243 to facilitate (i) a determination of DLL lock quality, and (ii) the calibration and relocking of a delay locked loop. Processor 230 may also execute the closed loop bank selection software module 244 to facilitate a determination that a tuning voltage indicates a VCO needs to be relocked, and to facilitate an iterative determination of an appropriate frequency tuning setting to relock the VCO. Processor 230 may also execute the open loop bank selection software module 245 to facilitate the performance of an open-loop VCO calibration operation (e.g., by resetting a synthesizer of the VCO) for determining an appropriate frequency tuning setting for the VCO.

Figure 3:
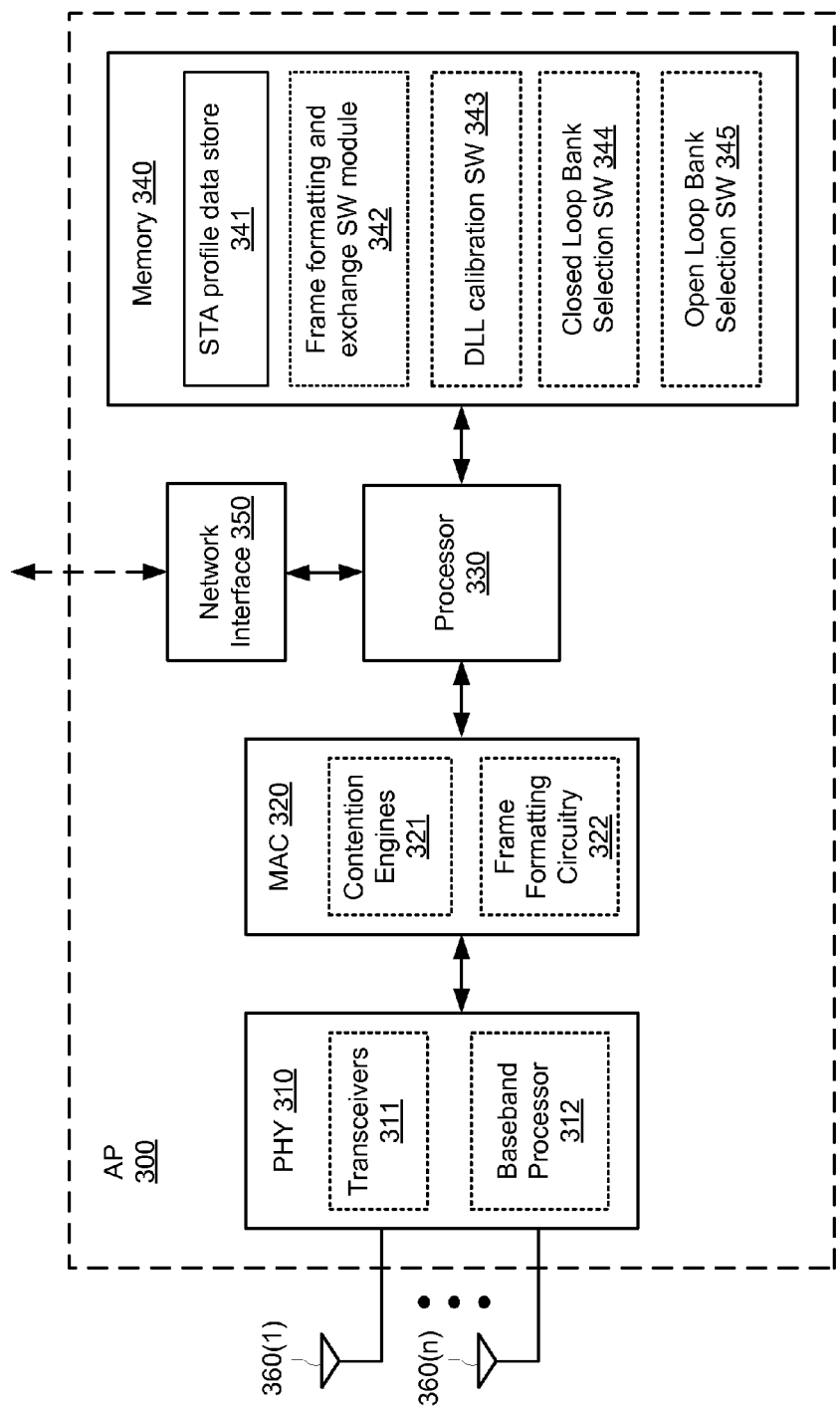
FIG. 3 shows a block diagram of an access point (AP) in accordance with example embodiments.

FIG. 3 shows an example AP 300 that may be one embodiment of the AP 110 of FIG. 1. AP 300 may include a PHY device 310 including at least a number of transceivers 311 and a baseband processor 312, may include a MAC 320 including at least a number of contention engines 321 and frame formatting circuitry 322, may include a processor 330, may include a memory 340, may include a network interface 350, and may include a number of antennas 360(1)-360(n). The transceivers 311 may be coupled to antennas 360(1)-360(n), either directly or through an antenna selection circuit (not shown for simplicity). The transceivers 311 may be used to communicate wirelessly with one or more STAs, with one or more other APs, and/or with other suitable devices. Although not shown in FIG. 3 for simplicity, the transceivers 311 may include any number of transmit chains to process and transmit signals to other wireless devices via antennas 360(1)-360(n), and may include any number of receive chains to process signals received from antennas 360(1)-360(n). Thus, for example embodiments, the AP 300 may be configured for MIMO operations including, for example, SU-MIMO operations and MU-MIMO operations.

The baseband processor 312 may be used to process signals received from processor 330 and/or memory 340 and to forward the processed signals to transceivers 311 for transmission via one or more of antennas 360(1)-360(n), and may be used to process signals received from one or more of antennas 360(1)-360(n) via transceivers 311 and to forward the processed signals to processor 330 and/or memory 340.

The network interface 350 may be used to communicate with a WLAN server (not shown for simplicity) either directly or via one or more intervening networks and to transmit signals.

Processor 330, which is coupled to PHY device 310, to MAC 320, to memory 340, and to network interface 350, may be any suitable one or more processors capable of executing scripts or instructions of one or more software programs stored in AP 300 (e.g., within memory 340). For purposes of discussion herein, MAC 320 is shown in FIG. 3 as being coupled between PHY device 310 and processor 330. For actual embodiments, PHY device 310, MAC 320, processor 330, memory 340, and/or network interface 350 may be connected together using one or more buses (not shown for simplicity).

The contention engines 321 may contend for access to the shared wireless medium, and may also store packets for transmission over the shared wireless medium. For some embodiments, AP 300 may include one or more contention engines 321 for each of a plurality of different access categories. For other embodiments, the contention engines 321 may be separate from MAC 320. For still other embodiments, the contention engines 321 may be implemented as one or more software modules (e.g., stored in memory 340 or within memory provided within MAC 320) containing instructions that, when executed by processor 330, perform the functions of contention engines 321.

The frame formatting circuitry 322 may be used to create and/or format frames received from processor 330 and/or memory 340 (e.g., by adding MAC headers to PDUs provided by processor 330), and may be used to re-format frames received from PHY device 310 (e.g., by stripping MAC headers from frames received from PHY device 310).

Memory 340 may include a STA profile data store 341 that stores profile information for a plurality of STAs. The profile information for a particular STA may include information including, for example, its MAC address, previous AP-initiated channel sounding requests, supported data rates, connection history with AP 300, and any other suitable information pertaining to or describing the operation of the STA.

Memory 340 may also include a non-transitory computer-readable medium (e.g., one or more nonvolatile memory elements, such as EPROM, EEPROM, Flash memory, a hard drive, and so on) that may store at least the following software (SW) modules:

- a frame formatting and exchange software module 342 to facilitate the creation and exchange of any suitable frames (e.g., data frames, action frames, and management frames) between AP 300 and other wireless devices (e.g., as described for one or more operations of FIG. 8);

a delay locked loop (DLL) calibration software module 343 to facilitate (i) a determination of DLL lock quality, and (ii) the calibration and relocking of a delay locked loop (e.g., as described for one or more operations of FIG. 8);

a closed loop bank selection software module 344 to facilitate a determination that a tuning voltage indicates a VCO needs to be relocked, and to facilitate an iterative determination of an appropriate frequency tuning setting to relock the VCO (e.g., as described for one or more operations of FIG. 8); and an open loop bank selection software module 345 to facilitate the performance of an open-loop VCO calibration operation (e.g., by resetting a synthesizer of the VCO) for determining an appropriate frequency tuning setting for the VCO (e.g., as described for one or more operations of FIG. 8).

Each software module includes instructions that, when executed by processor 330, cause AP 300 to perform the corresponding functions. The non-transitory computer-readable medium of memory 340 thus includes instructions for performing all or a portion of the AP-side operations depicted in FIG. 8.

Processor 330, which is shown in the example of FIG. 3 as coupled to PHY device 310 via MAC 320, to memory 340, and to network interface 350, may be any suitable one or more processors capable of executing scripts or instructions of one or more software programs stored in AP 300 (e.g., within memory 340). For example, processor 330 may execute the frame formatting and exchange software module 342 to facilitate the creation and exchange of any suitable frames (e.g., data frames, action frames, and management frames) between AP 300 and other wireless devices. Processor 330 may also execute the delay locked loop (DLL) calibration software module 343 to facilitate (i) a determination of DLL lock quality, and (ii) the calibration and relocking of a delay locked loop. Processor 330 may also execute the closed loop bank selection software module 344 to facilitate a determination that a tuning voltage indicates a VCO needs to be relocked, and to facilitate an iterative determination of an appropriate frequency tuning setting to relock the VCO. Processor 330 may also execute the open loop bank selection software module 345 to facilitate the performance of an open-loop VCO calibration operation (e.g., by resetting a synthesizer of the VCO) for determining an appropriate frequency tuning setting for the VCO.

Figure 4:
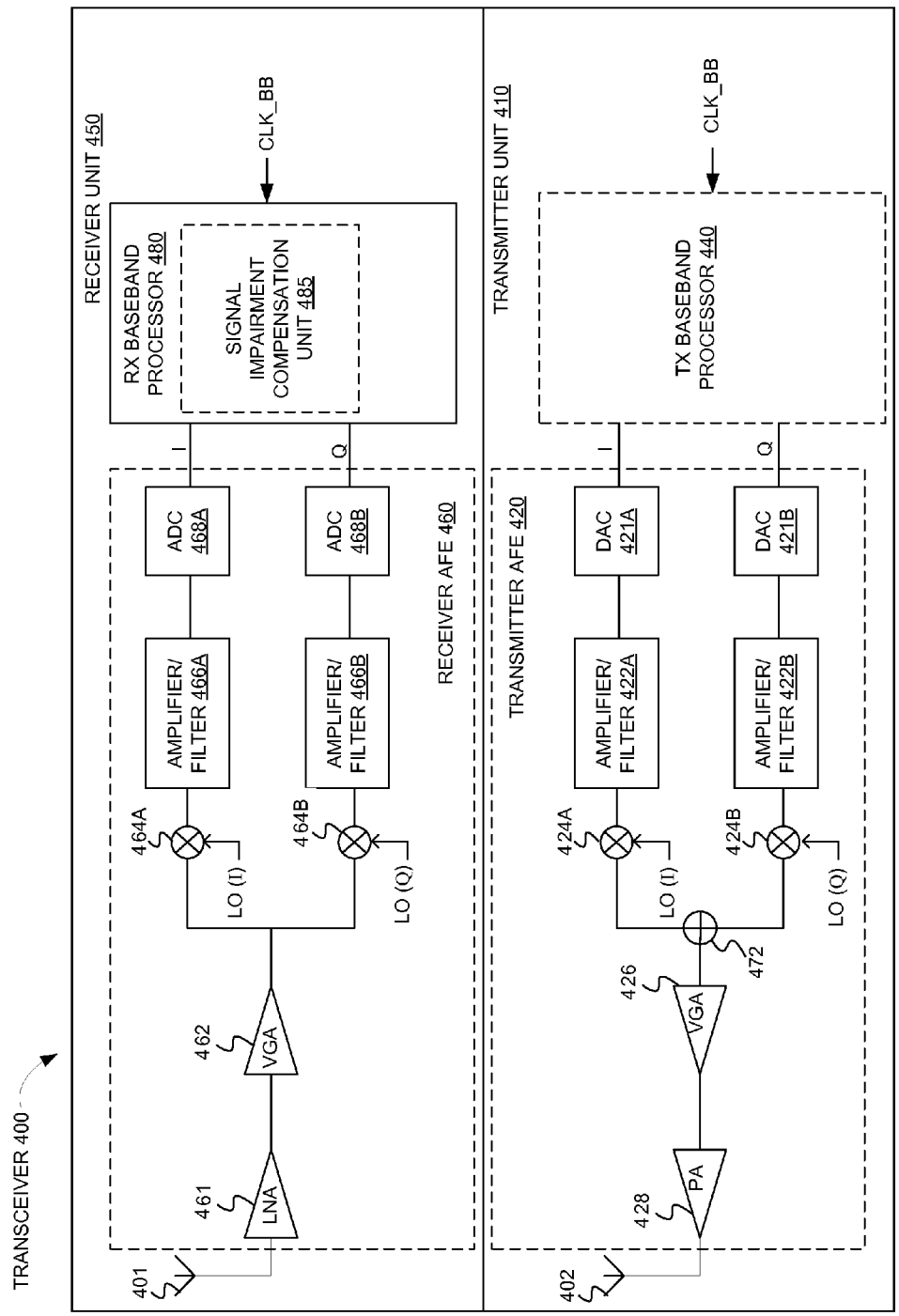
FIG. 4 shows a block diagram of an example wireless transceiver in accordance with example embodiments.

FIG. 4 is a block diagram of an example transceiver 400 that may be one embodiment of one or more of the transceivers 211 of the STA 200 of FIG. 2 and/or transceivers 311 of AP 300 of FIG. 3. Transceiver 400, which is shown in FIG. 4 as including a transmitter unit 410 and a receiver unit 450, may utilize quadrature amplitude modulation (QAM) schemes for exchanging data (e.g., symbols) with other wireless devices. Further, although shown in FIG. 4 as including a single-chain transmitter unit 410 and a single-chain receiver unit 450, the transceiver 400 may include any number (e.g., a multitude) of transmit chains and receive chains, for example, to provide MIMO capabilities, dual-band operation, channel diversity, and so on.

The transmitter unit 410 may include one or more antennas 402, a transmitter analog front end (AFE) 420, and a transmitter baseband processor 440. The receiver unit 450 includes one or more antennas 401, a receiver AFE 460, and a receiver baseband processor 480. In some examples, the receiver baseband processor 480 may include a signal impairment compensation unit 485 for estimating and compensating for signal impairments introduced both in the transmitter and receiver, as depicted in the example of FIG. 4.

In the example of FIG. 4, the transmitter AFE 420 includes a digital-to-analog converter (DAC) 421A for the in-phase (I) signal path, amplifier/filter 422A for the I signal path, a local oscillator (LO) mixer 424A for the I signal path, a DAC 421B for the quadrature (Q) signal path, amplifier/filter 422B for the Q signal path, an LO mixer 424B for the Q signal path, a combiner 472, a variable gain amplifier (VGA) 426, and a power amplifier (PA) 428. The mixers 424A and 424B up-convert the I and Q signals from baseband directly to the carrier frequency by mixing the I and Q signals with local oscillator signals LO(I) and LO(Q), where the frequency of the local oscillator signals LO(I) and LO(Q) may be the carrier frequency. Mismatch between mixers 424A and 424B, between amplifiers/filters 422A and 422B, and/or between DACs 421A and 421B may result in transmitter-side I/O mismatch. The combiner 472 combines the up-converted I and Q signals into a transmit signal that may be amplified by VGA 426 and PA 428 before wireless transmission from antenna 402 (e.g., at the carrier frequency for a channel selected for transmission).

The receiver AFE 460 includes a low-noise amplifier (LNA) 461, a VGA 462, an LO mixer 464A for the I signal path, amplifier/filter 466A for the I signal path, an analog-to-digital converter (ADC) 468A for the I signal path, an LO mixer 464B for the Q signal path, amplifier/filter 466B for the Q signal path, and an ADC 468B for the Q signal path. The mixers 464A and 464B directly down-convert the received signal into baseband I and Q signals by mixing the received signal with local oscillator signals LO(I) and LO(Q), where the frequency of the local oscillator signals (as generated by a local oscillator, not shown in FIG. 4 for simplicity) is ideally the carrier frequency.

Mismatch between mixers 464A and 464B, between amplifiers/filters 466A and 466B, and/or between ADCs 468A and 468B may result in receiver-side I/O mismatch. A difference between the frequency of the local oscillator signals in the receiver unit 450 and the corresponding frequency of local oscillator signals in the transmitter unit 410 may result in carrier frequency offset. Further, a difference between the phase and/or frequency of the local oscillator signals in the receiver unit 450 and the corresponding phase and/or frequency of local oscillator signals in the transmitter unit 410 may result in carrier phase offset.

The components described with reference to FIG. 4 are exemplary only. In various embodiments, one or more of the components described may be omitted, combined, or modified, and additional components may be included. For example, the transmitter unit 410 and receiver unit 450 may share one or more common antennas, or may have various additional antennas and transmitter/receiver chains. In some implementations, the transceiver 400 may include less or more filter and/or amplifier circuitry (e.g., blocks 422 and 466 of FIG. 4).

As described above, the example embodiments describe methods and systems for providing a closed loop bank selection (CLBS) operation, which may determine whether frequency drift of a VCO has reached an unacceptable level by examining one or more VCO lock quality indicators. In some embodiments, the one or more VCO lock quality indicators may include one or more bits indicating the status of a fine tuning voltage Vtune associated with the frequency output of the VCO. In some embodiments, the examination of the one or more VCO lock quality indicators may be triggered by a rising or falling edge of a signal associated with enabling or disabling a transmitter or receiver (e.g., signals including a "transmitter on" (TX_ON) signal, a "receiver on" (RX_ON) signal, etc.). Upon being triggered, the CLBS operation may examine the one or more VCO lock quality indicators and determine that a lock quality is insufficient. For example, the lock quality indicators may include two bits—V2low and V2hi—which respectively indicate that the fine tuning voltage Vtune is below a specified range or value and that the fine tuning voltage Vtune is above the specified range or value. In other embodiments, the VCO lock quality indicators may, in addition to indicating whether Vtune is too high or too low, provide an indication that the value of Vtune is more than a threshold voltage above or below the specified range or value. For example, the lock indicators may include a signal Voff_0.25, which may indicate that Vtune is either at least 0.25 V above or at least 0.25 V below the specified range or value. Accordingly, determining that the lock quality is insufficient may additionally include determining whether a lock quality indicator (such as Voff_0.25) indicates that the value of Vtune is more than a threshold voltage outside of (e.g., greater than or less than) the specified range or value.

If, after examining the lock quality indicators, it is determined that the VCO's temperature-dependent drift has reached an unacceptable level, a closed-loop bank selection operation may be performed to adjust a frequency tuning setting of the VCO (e.g., a bank code of a VCO capacitor bank, a varactor voltage, a regulator output, a VCO gain setting, etc.) to compensate for the temperature-dependent drift. In some embodiments, a bank code may include 9, 10, or 11 bits, although in other embodiments, the bank code may be of other lengths.

Figure 5A:
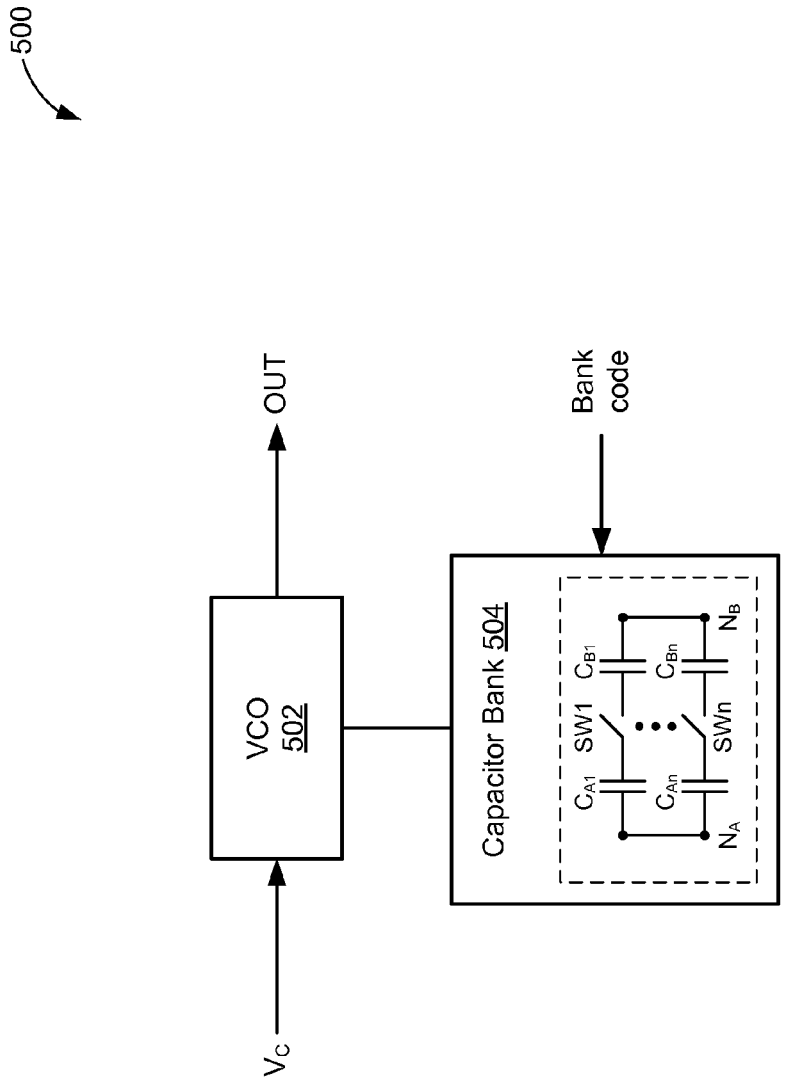
FIG. 5A shows a block diagram of a signal generator including a VCO and a switched capacitor bank in accordance with example embodiments.

FIG. 5A shows a block diagram of an oscillator circuit 500 that may be used in one or more example embodiments. The oscillator circuit 500 is shown to include a VCO 502 and a capacitor bank 504. The VCO 502 may be any suitable VCO or other suitable oscillator that generates an output signal (OUT) having a frequency that is based, at least in part, on a control voltage ($V_C$). The capacitor bank 504, which is coupled to the VCO 502, may be any suitable capacitor bank, variable capacitor, or other suitable circuit that provides an adjustable capacitance based, at least in part, on a bank code. The adjustable capacitance provided by the capacitor bank 504 may be used to tune the VCO 502, for example, so that the output signal OUT oscillates at a selected (e.g., desired) frequency. For the example of FIG. 5A, the capacitor bank 504 is shown to include a number of switches SW1-SWn that may be used to selectively couple a corresponding number of capacitor pairs $C_{A1}/C_{B1}$ to $C_{An}/C_{Bn}$ between nodes $N_A$ and $N_B$ of the capacitor bank 504. The switches SW1-SWn may be controlled by a corresponding number of control signals (not shown for simplicity) embodied with the bank code. Thus, by selectively turning on different numbers of the switches SW1-SWn in response to the bank code, the total capacitance provided by the capacitor bank 504 may be adjusted, which in turn may tune the frequency of the VCO 502.

Figure 5B:
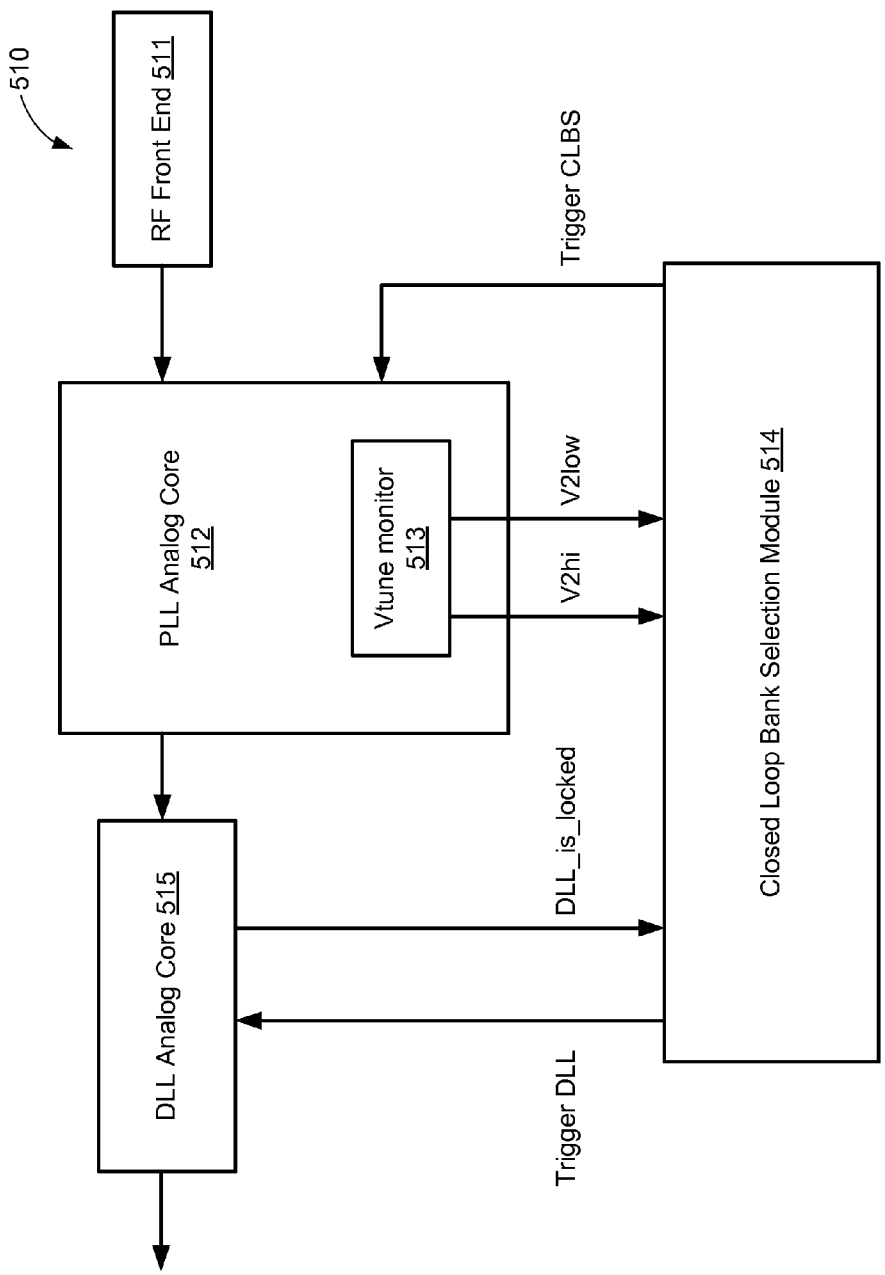
FIG. 5B shows a block diagram of example modules for implementing the example embodiments.

FIG. 5B shows a block diagram 510 showing modules for performing a CLBS operation, in accordance with example embodiments. As shown in FIG. 5B, modules for performing example CLBS operations may include an RF front end 511, a phase locked loop (PLL) analog core 512, a Vtune monitor 513, a closed loop bank selection (CLBS) module 514, and a delay locked loop (DLL) analog core 515. In other embodiments, modules for performing example CLBS operations may include other combinations of modules—for example, DLL analog core 515 may not be present in other embodiments. Additionally, while Vtune monitor 513 is shown in FIG. 5B as included within PLL analog core 512, in other embodiments, Vtune monitor 513 may be separate from PLL analog core 512. As previously described, VCOs may commonly be used in phase locked loops (PLLs), and a VCO such as VCO 502 of FIG. 5A may be included in PLL analog core 512. In some embodiments, RF front end 511 may be part of receiver unit 450 of transceiver 400 of FIG. 4, and may include antenna 401, LNA 461, VGA 462, and mixers 464A and 464B. In other embodiments, RF front end 511 may include other components.

In example embodiments, PLL analog core 512 may receive signals from RF front end 511, and provide a phase locked signal to DLL analog core 515. Upon detecting a trigger condition, which may be a rising or a falling edge of a signal associated with enabling or disabling a transmitter or receiver (e.g., a TX_ON or an RX_ON signal), DLL analog core 515 may send an indication of DLL lock status, such as a signal DLL_is_locked, to CLBS module 514. If the DLL lock status indicates the DLL has unacceptable lock quality, CLBS module 514 may send a trigger DLL signal to cause DLL analog core 515 to relock its DLL. After determining that the DLL lock status is acceptable, or after the DLL analog core's DLL is relocked, Vtune monitor 513 may send one or more lock indicators to CLBS 514. In some embodiments, these one or more lock indicators may be the signals V2low and V2hi, which respectively indicate that Vtune is below a minimum specified value or above a maximum specified value (e.g., V2low=1 may indicate that Vtune is below the minimum specified value, and V2low=0 may indicate that Vtune is not below the minimum specified value; V2hi=1 may indicate that Vtune is above the maximum specified value, and V2hi=0 may indicate that Vtune is not above the maximum specified value). If the one or more lock indicators indicate that Vtune is outside of the specified range, then CLBS module 514 may trigger a closed loop bank selection operation for returning the value of Vtune to be within the specified range.

In accordance with the example embodiments, the CLBS operations may adjust a frequency tuning setting, such as a bank code of a switched capacitor bank associated with the VCO in order to return Vtune to be within the specified range, and thereby compensate for the temperature-dependent frequency drift of the VCO. The frequency tuning setting may alternatively be a varactor voltage, a regulator output, or a VCO gain setting. In some implementations, the frequency of the VCO may decrease as Vtune increases. In other implementations, the frequency of the VCO may increase as Vtune increases. Further, in some implementations, the frequency of the VCO may decrease as the value of the frequency tuning setting increases. In other implementations, the frequency of the VCO may increase as the value of the frequency tuning setting increases. Thus, for at least some example embodiments, the CLBS operations may adjust the bank code provided to the capacitor bank 504 associated with VCO 502 (see also FIG. 5A), for example, to compensate for frequency drift of the VCO 502.

Because the one or more lock quality indicators indicate whether Vtune is too high or too low, it is known whether to increase or decrease the frequency tuning setting. Accordingly, in some embodiments, a CLBS operation may (i) increase or decrease the frequency tuning setting by a predetermined amount, and then (ii) determine whether the lock quality indicators indicate that Vtune has returned to the specified range. If the lock quality indicators indicate that Vtune has not returned to the specified range, then the CLBS operation may repeat steps (i) and (ii) until the lock quality indicators indicate that Vtune has returned to the specified range.

In some embodiments where the frequency tuning setting is a capacitor bank code, different bits of the capacitor bank code may increase or decrease the value of Vtune—and through Vtune, increase or decrease the frequency of the VCO—by differing amounts. Accordingly, the bank code may be adjusted by a predetermined amount which may be based at least in part on the current value of the capacitor bank code. The predetermined amount may be stored in a lookup table, and a CLBS operation may look up the predetermined amount to adjust the capacitor bank code. If the lock quality indicators include one or more indications of how far Vtune is from the specified range, then the predetermined amount may additionally depend on the one or more indications. For example, as previously discussed, the lock quality indicators may include a V2low signal, a V2hi signal, and a threshold indicator, indicating that Vtune is more than a threshold voltage outside of the specified range. In such systems, the capacitor bank code may be adjusted by a first predetermined amount if V2low is set (e.g., to a logic 1), and the threshold indicator (such as Voff_0.25) is reset. The lock quality indicator setting may indicate that the value of Vtune is below the specified range but is less than the threshold voltage below the specified range. The capacitor bank code may be adjusted by a second predetermined amount if V2low and the threshold indicator are both set (e.g., to a logic 1). The lock quality indicator setting may indicate that Vtune is at least the threshold voltage below the specified range, indicating that a larger correction is needed than would be provided by the first predetermined amount.

Some example VCOs may have one or more regions of frequency overlap. A region of frequency overlap may be a region in which the VCO frequency trends in the opposite direction, with respect to the frequency tuning setting, as would normally be expected. For example, if a VCO frequency generally decreases as the frequency tuning setting increases, in a region of frequency overlap, the VCO frequency will increase as the frequency tuning setting increases. Regions of frequency overlap may ensure a VCO covers all frequencies in a supported frequency range by providing redundancy. For example, a group of capacitor bank codes associated with regions of frequency overlap may be referred to as a most significant bit (MSB) group (as regions of frequency overlap may be associated with transitions to bank codes where an MSB is set). Because VCO frequency trends in the opposite direction as normally expected, a CLBS operation may experience inefficiencies when the capacitor bank code is in an MSB group. For example, if Vtune is too high, and normally the capacitor bank code would be increased to compensate for the high value of Vtune, in a region of frequency overlap increasing the capacitor bank code will increase Vtune even further, thereby necessitating additional redundant steps and capacitor bank code adjustments in the CLBS operation before Vtune decreases.

Figure 6:
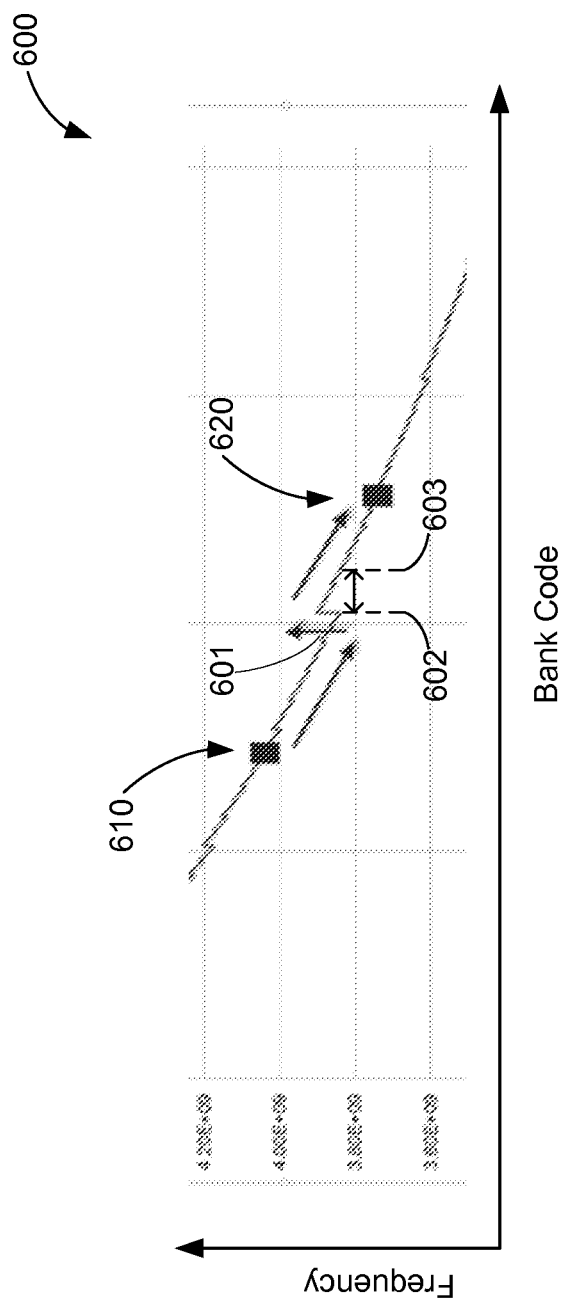
FIG. 6 shows a plot depicting a region of frequency overlap of a voltage controlled oscillator (VCO), in accordance with example embodiments.

FIG. 6 depicts a graph 600 of VCO frequency vs. capacitor bank code, showing an example region of frequency overlap, in accordance with example embodiments. A CLBS operation may be initiated when the VCO and capacitor bank code are at position 610. The lock quality indicators may indicate that the VCO frequency needs to be decreased. The VCO may have an intended frequency as indicated by position 620. Accordingly, as shown in graph 600, the capacitor bank code must be increased. However, for the capacitor bank codes that lie between positions 610 and 620, there is a region of frequency overlap, starting at a position indicated by the upward arrow 601. Consequently, while adjusting the capacitor bank code to decrease the VCO frequency, there may be redundant steps when the capacitor bank code is in a region between positions 602 and 603, and the CLBS operation may take longer than necessary to complete. For example, the VCO frequency has the same value at position 602 and position 603—if the VCO frequency is too high at position 602, the VCO frequency will be exactly as high at position 603. Any adjustments to increase the capacitor bank code from position 602 to position 603 are redundant.

In some examples, the time-inefficiency caused by these redundant steps may be acceptable, and may allow for a comparatively less complicated CLBS operation. In these examples, a CLBS operation may use a standard operation that adjusts the capacitor bank code by the predetermined amount without considering MSB groups. Such operations may be called type 0 operations. In other examples, time-efficiency may be more important, and accordingly, a CLBS operation may detect that a current capacitor bank code indicates the presence of a region of frequency overlap, and may adjust the capacitor bank code by a specified amount to skip over the region of frequency overlap, thus reducing or eliminating the number of redundant steps. These operations may be called type 1 operations. In further examples, a CLBS operation may detect that a current capacitor bank code indicates the presence of a region of frequency overlap, and may trigger a conventional open-loop VCO calibration operation (e.g., by resetting the synthesizer). The conventional open-loop bank selection operation may take longer to complete than the other alternatives (and may take 60 µs or longer), but will both accurately and reliably locate the proper capacitor bank code setting. The third type of CLBS operation may be called a type 2 operation.

Type 0 operations may be relatively simple to implement. Type 1 operations may be relatively time-efficient, avoiding some or all of the redundant steps caused by the region of frequency overlap. Type 2 operations may take longer than type 0 or type 1 operations, but may accurately and reliably determine a bank code setting to place the VCO frequency in the specified range.

Figure 7:
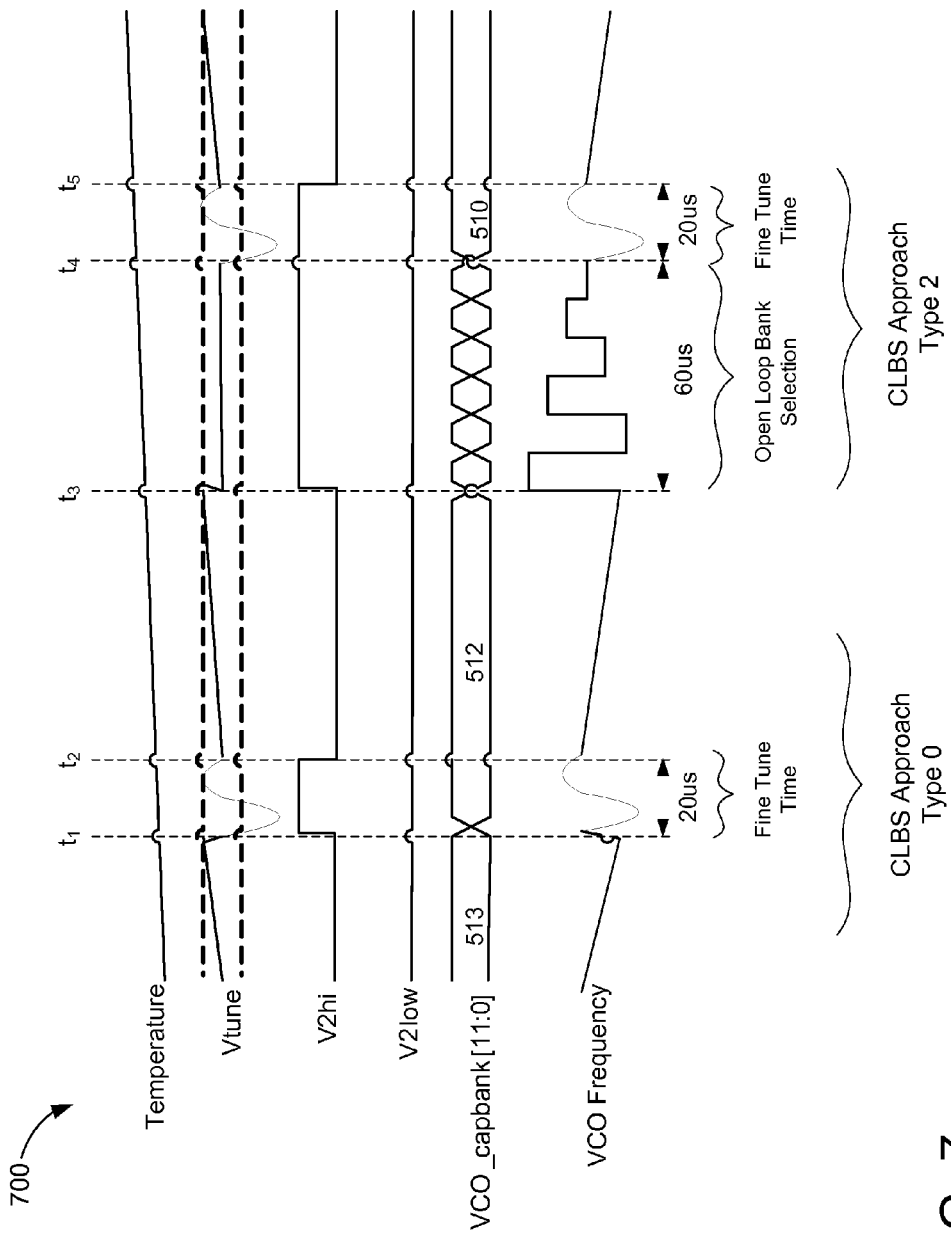
FIG. 7 is a time sequence diagram showing example closed loop bank selection operations, in accordance with example embodiments.

FIG. 7 is a time sequence diagram 700 showing example CLBS operations, in accordance with example embodiments. Note that the scale of differences in temperature and frequency has been exaggerated for emphasis and clarity. As previously described, a VCO may have temperature-dependent frequency drift, so as temperature increases in FIG. 7, the VCO frequency drifts downward (e.g., the VCO frequency decreases). As VCO frequency drifts, the tuning voltage Vtune also changes—in FIG. 7 the value of Vtune is shown to increase as the VCO frequency decreases. At time $t_1$, the value of Vtune exceeds the specified range (indicated by dotted lines in FIG. 7). A lock quality indicator V2hi is set to indicate that the value of Vtune has exceeded the specified range. A CLBS operation is then performed, which may result in the bank code (indicated by the 12 bit value of VCO_capbank[11:0]) being reduced from 513 to 512. The CLBS operation may end at time $t_2$, after which the value of Vtune has returned to the specified range, V2hi is reset, and the VCO frequency has been increased to compensate for the temperature-dependent frequency drift. In some examples, the CLBS operation may take approximately 20 µs.

As the temperature continues to increase, the VCO frequency continues to decrease, and the value of Vtune continues to increase, for example, until the value of Vtune exceeds the specified range again at time $t_3$. At time $t_3$, V2hi is again set (e.g., to logic 1). The bank code 512 may be in an MSB group—as previously described MSB groups may contain bank codes for which a most significant bit is set, and $(512)_{10}=(01000000000)_2$. Because the bank code is in an MSB group, there may be an associated region of frequency overlap. In FIG. 7, at time $t_3$, a CLBS operation of type 2 is performed. As previously mentioned, type 2 operations may be slow but accurate and reliable. An example type 2 operation may include an open loop bank selection operation (which may take approximately 60 μs, in some examples) that ends at time $t_4$, and a fine tune operation (which is faster than the open loop bank selection and may take approximately 20 μs) ends at time $t_5$. After the type 2 CLBS operation completes, the bank code is reduced to 511, the value of Vtune has returned to the specified range, V2hi is reset (e.g., to logic 0), and the VCO frequency has increased to compensate for the temperature-dependent frequency drift.

FIG. 8 is an illustrative flow chart depicting an example operation 800 to compensate for temperature-dependent drift of a voltage controlled oscillator (VCO), in accordance with example embodiments. Operation 800 may be performed by any suitable wireless device, for example, each of STA1-STA4 and AP 110 of FIG. 1, STA 200 of FIG. 2, and/or AP 300 of FIG. 3.

As shown in FIG. 8, a signal edge associated with a transceiver may be detected (801). The signal edge may be either a rising edge or a falling edge, for example, of a transmitter on (TX_ON) signal or a receiver on (RX_ON) signal associated with a transceiver. In some examples, the transceiver may be one or more of transceivers 211 of STA 200 of FIG. 2, may be one or more of transceivers 311 of AP 300 of FIG. 3, may be one or more components of transceiver 400 of FIG. 4, and/or may be RF front end 511 of FIG. 5B.

Although not shown in operation 800 for simplicity, if a delay locked loop (DLL) is present in the transceiver, such as DLL analog core 515 of FIG. 5B, then a determination may be made as to whether the DLL has a sufficient lock quality. The determination may be made by determining whether one or more DLL lock signals indicate that the DLL has a sufficient lock quality. For example, DLL analog core 515 of FIG. 5B may indicate whether the DLL has a sufficient lock quality using the DLL_is_locked signal. If the DLL lock quality is insufficient, then a DLL calibration operation may be triggered. For example, as shown in FIG. 5B, CLBS module 514 may trigger a DLL calibration operation by sending the Trigger DLL signal to DLL analog core 515.

After detecting a signal edge (and selectively calibrating a DLL), a determination may be made that one or more lock quality signals indicate that the VCO frequency is outside of a specified range (802). In some examples, the determination may be made by executing closed loop bank selection software module 244 of STA 200 of FIG. 2, by executing closed loop banks selection software module 344 of AP 300 of FIG. 3, or using closed loop bank selection module 514 of FIG. 5B. In some examples, the determination may be made by determining that a tuning voltage Vtune is outside of a specified range. The one or more lock quality signals may be a signal indicating that Vtune is above the specified range (e.g., greater than a maximum specified value), and a signal indicating that Vtune is below the specified range (e.g., less than a minimum specified value). In some examples, the one or more lock quality signals may additionally include a signal indicating that Vtune is at least a threshold voltage outside of the specified range.

After determining that the one or more lock quality indicators indicate that the VCO frequency is outside of the specified range, a frequency tuning setting of the VCO may be adjusted based at least in part on the one or more lock quality signals (803). In some examples, this frequency tuning setting may be a capacitor bank code, a varactor voltage, a regulator output, a VCO gain value, or another suitable VCO control signal. In some examples, the frequency tuning setting may be adjusted by executing closed loop bank selection software module 244 of STA 200 of FIG. 2, by executing closed loop banks selection software module 344 of AP 300 of FIG. 3, and/or using closed loop bank selection module 514 of FIG. 5B. The frequency tuning setting may be adjusted by a predetermined amount, and in a direction indicated by the one or more lock quality signals. The predetermined amount may be based at least in part on a current value of the frequency tuning setting. In some examples, the frequency tuning setting may be adjusted by repeatedly adjusting the frequency tuning setting until the one or more lock quality signals indicate that the VCO frequency has returned to the specified range. In some examples, one or more values of the frequency tuning setting may be a member of an MSB group associated with a region of frequency overlap. When the frequency tuning setting is a member of an MSB group, the predetermined value may include a number of frequency tuning setting values to skip over the region of frequency overlap. In other examples, when the frequency tuning setting is a member of an MSB group, an open-loop VCO calibration operation may be performed (e.g., by resetting the synthesizer).

After adjusting the frequency tuning setting based on the one or more lock quality signals, a determination may be made that the one or more lock quality signals indicate that the VCO frequency has returned to the specified range (804). The determination may be made by executing closed loop bank selection software module 244 of STA 200 of FIG. 2, by executing closed loop bank selection software module 344 of AP 300 of FIG. 3, using Vtune monitor 513, and/or using closed loop bank selection module 514 of FIG. 5B. In some examples, the determination may include determining that lock quality signals V2low and V2hi are both reset (e.g., to logic 0), thereby indicating that the value of Vtune is neither below nor above the specified range.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate the interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A method for compensating for frequency drift of a voltage controlled oscillator (VCO) in a transceiver, the method comprising:
   detecting a signal edge associated with the transceiver;
   determining that one or more lock quality signals indicate that the VCO frequency is outside of a specified range;
   adjusting a frequency tuning setting of the VCO based at least in part on the one or more lock quality signals; and
   determining that the one or more lock quality signals subsequently indicate that the VCO frequency has returned to the specified range, wherein a set of allowable frequency tuning settings includes one or more frequency tuning settings associated with a region of frequency overlap, and wherein adjusting the frequency tuning setting further comprises:
      determining that a current value of the frequency tuning setting is associated with the region of frequency overlap; and
      in response to determining that the current value of the frequency tuning setting is associated with the region of frequency overlap, triggering an open-loop calibration operation.

2. The method of claim 1, wherein adjusting the frequency tuning setting comprises adjusting a capacitor bank code by a predetermined amount based at least in part on the one or more lock quality signals and in a direction indicated by the one or more lock quality signals.

3. The method of claim 2, wherein the predetermined amount is based at least in part on a current value of the capacitor bank code.

4. The method of claim 1, wherein adjusting the frequency tuning setting comprises repeatedly adjusting the frequency tuning setting until the one or more lock quality signals indicate that the VCO frequency has returned to the specified range.

5. The method of claim 1, wherein the signal edge is a rising edge or a falling edge of a signal associated with enabling or disabling a transmitter or a receiver.

6. The method of claim 1, wherein the one or more lock quality signals comprise one or more signals indicating a status of a VCO fine tuning voltage.

7. The method of claim 6, wherein the one or more lock quality signals comprise at least one member of the group consisting of (i) a signal indicating that the VCO fine tuning voltage is above the specified range, and (ii) a signal indicating that the VCO fine tuning voltage is below the specified range.

8. A circuit to compensate for frequency drift of a voltage controlled oscillator (VCO), the circuit comprising:
   one or more processors;
   one or more transceivers;
   a VCO including a switched capacitor bank comprising a plurality of switched capacitors; and
   a memory storing one or more programs comprising instructions that, when executed by the one or more processors, cause the circuit to perform operations comprising:
      detecting a signal edge associated with the one or more transceivers;
      determining that one or more lock quality signals indicate that the VCO frequency is outside of a specified range;
      adjusting a capacitor bank code of the VCO based at least in part on the one or more lock quality signals; and
      determining that the one or more lock quality signals subsequently indicate that the VCO frequency has returned to the specified range, wherein a set of allowable frequency tuning settings includes one or more frequency tuning settings associated with a region of frequency overlap in the VCO, and wherein execution of the instructions to adjust the frequency tuning setting causes the circuit to perform operations further comprising:
         determining that a current value of the frequency tuning setting is associated with the region of frequency overlap; and
         in response to determining that the current value of the frequency tuning setting is associated with the region of frequency overlap, triggering an open-loop VCO calibration operation.

9. The circuit of claim 8, wherein the VCO includes a switched capacitor bank comprising a plurality of switched capacitors, wherein the frequency tuning setting comprises a capacitor bank code of the switched capacitor banks; and
   wherein execution of the instructions to adjust the frequency tuning setting causes the circuit to perform operations further comprising:
      adjusting the capacitor bank code by a predetermined amount based at least in part on the one or more lock quality signals, and in a direction indicated by the one or more lock quality signals.

10. The circuit of claim 9, wherein the predetermined amount is based at least in part on a current value of the capacitor bank code.

11. The circuit of claim 8, wherein a wireless communications device includes the circuit.

12. The circuit of claim 8, wherein the signal edge is a rising edge or a falling edge of a signal associated with enabling or disabling a transmitter or a receiver.

13. The circuit of claim 8, wherein the one or more lock quality signals comprise one or more signals indicating a status of a VCO fine tuning voltage.

14. The circuit of claim 13, wherein the one or more lock quality signals comprise at least one member of the group consisting of (i) a signal indicating that the VCO fine tuning voltage is above the specified range, and (ii) a signal indicating that the VCO fine tuning voltage is below the specified range.

15. A non-transitory computer-readable storage medium storing one or more programs containing instructions that, when executed by one or more processors of a communication device, cause the communication device to perform operations comprising:
- detecting a signal edge associated with a transceiver in the communication device;
- determining that one or more lock quality signals indicate that a voltage controlled oscillator (VCO) has a frequency outside of a specified range;
- adjusting a frequency tuning setting of the VCO based at least in part on the one or more lock quality signals; and
- determining that the one or more lock quality signals subsequently indicate that the VCO frequency has returned to the specified range, wherein a set of allowable frequency tuning settings includes one or more frequency tuning settings associated with a region of frequency overlap in the VCO, and wherein execution of the instructions to adjust the frequency tuning setting causes the communication device to perform operations further comprising:
    - determining that a current value of the frequency tuning setting is associated with the region of frequency overlap; and
    - in response to determining that the current value of the frequency tuning setting is associated with the region of frequency overlap, triggering an open-loop VCO calibration operation.

16. The non-transitory computer-readable storage medium of claim 15, wherein the frequency tuning setting comprises a capacitor bank code, and execution of the instructions to adjust the frequency tuning setting causes the communication device to adjust the capacitor bank code by a predetermined amount based at least in part on the one or more lock quality signals, and in a direction indicated by the one or more lock quality signals.

17. The non-transitory computer-readable storage medium of claim 15, wherein execution of the instructions to adjust the frequency tuning setting causes the communication device to perform operations further comprising:
- repeatedly adjusting the frequency tuning setting until the one or more lock quality signals indicate that the VCO frequency has returned to the specified range.

18. The non-transitory computer-readable storage medium of claim 15, wherein the signal edge is a rising edge or a falling edge of a signal associated with enabling or disabling a transmitter or a receiver.

19. The non-transitory computer-readable storage medium of claim 15, wherein the one or more lock quality signals comprise one or more signals indicating a status of a VCO fine tuning voltage.

20. The non-transitory computer-readable storage medium of claim 19, wherein the one or more lock quality signals comprise at least one member of the group consisting of (i) a signal indicating that the VCO fine tuning voltage is above the specified range, and (ii) a signal indicating that the VCO fine tuning voltage is below the specified range.

21. The non-transitory computer-readable storage medium of claim 16, wherein the predetermined amount is based at least in part on a current value of the capacitor bank code.

22. A device to compensate for frequency drift of a voltage-controlled oscillator (VCO), the device comprising:
- means for detecting a signal edge associated with a transceiver in the device;
- means for determining that one or more lock quality signals indicate that a VCO frequency is outside of a specified range;
- means for adjusting a frequency tuning setting of the VCO based at least in part on the one or more lock quality signals; and
- means for determining that the one or more lock quality signals subsequently indicate that the VCO frequency has returned to the specified range, wherein a set of allowable frequency tuning settings includes one or more frequency tuning settings associated with a region of frequency overlap, and wherein the means for adjusting the frequency tuning setting is to:
    - determine that a current value of the frequency tuning setting is associated with the region of frequency overlap; and
    - in response to determining that the current value of the frequency tuning setting is associated with the region of frequency overlap, trigger an open-loop calibration operation.

23. The device of claim 22, wherein the means for adjusting the frequency tuning setting is to repeatedly adjust the frequency tuning setting by a predetermined amount based at least in part on the one or more lock quality signals, and in a direction indicated by the one or more lock quality signals until the one or more lock quality signals indicate that the VCO frequency has returned to the specified range.

24. The device of claim 23, wherein the predetermined amount is based at least in part on a current value of the frequency tuning setting.

* * * * *